United States Patent
Aubel et al.

(10) Patent No.: US 7,512,506 B2
(45) Date of Patent: Mar. 31, 2009

(54) IC CHIP STRESS TESTING

(75) Inventors: Oliver Aubel, Dresden (DE); Tom C. Lee, Essex Junction, VT (US); Deborah M. Massey, Jericho, VT (US); Travis S. Merrill, Rutland, VT (US); Stanley W. Polchlopek, Shelburne, VT (US); Alvin W. Strong, Essex Junction, VT (US); Timothy D. Sullivan, Underhill, VT (US)

(73) Assignees: International Business Machines Corporation, Armonk, NY (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/755,827

(22) Filed: May 31, 2007

(65) Prior Publication Data

US 2008/0297188 A1 Dec. 4, 2008

(51) Int. Cl.
*G06F 19/00* (2006.01)
*G01R 31/26* (2006.01)

(52) U.S. Cl. .................. 702/107; 702/117; 324/719; 324/765

(58) Field of Classification Search .......... 702/107, 702/117–119, 123; 324/719–721, 763, 765; 257/467, 666, 713
See application file for complete search history.

(56) References Cited

U.S. PATENT DOCUMENTS 5,514,974 A * 5/1996 Bouldin ................. 324/763

6,603,321 B2 * 8/2003 Filippi et al. ............ 324/719

OTHER PUBLICATIONS

Lee et al., "Comparison of Isothermal, Constant Current and SWEAT Wafer Level EM Testing Methods," IEEE 39th Annual International Reliability Physics Symposium, Orlando, Florida, 2001, pp. 172-183.
Von Hagen et al., "Temperature Determination Methods on Copper Material for Highly Accelerated Electromigration Tests (e.g. SWEAT)," IRW Final Report, 2002, pp. 45-49.
Marathe et al., "The Use Of A WLR Technique To Characterize Voiding In 0.25 and 0.18 um Technologies For Integrated Circuits," IEEE 37th Annual International Reliability Physics Symposium, San Diego, California, 1999, pp. 291-295.
Tibel et al., "Comparison of Via/Line Package Level Vs. Wafer Level Results," IEEE 39th Annual International Reliability Physics Symposium, Orlando, Florida, 2001, pp. 194-199.
Chen et al., "Measurements of Effective Thermal Conductivity for Advanced Interconnect Structures with Various Composite Low-K Dielectrics," IEEE 42nd Annual International Reliability Physics Symposium, Phoenix, Arizona, 2004, pp. 68-73.

* cited by examiner

*Primary Examiner*—Bryan Bui
(74) *Attorney, Agent, or Firm*—Todd M C Li; Hoffman Warnick LLC (57) ABSTRACT

Methods, systems and program products are disclosed for performing a stress test of a line in an integrated circuit (IC) chip. One embodiment of the method includes: applying a constant current $I_s$ to the line; and stress testing the line while applying the constant current $I_s$ such that the constant current $I_s$ is not altered by a resistance change due to an onset of electromigration.

14 Claims, 5 Drawing Sheets

IC CHIP STRESS TESTING

BACKGROUND

1. Technical Field

The disclosure relates generally to integrated circuit (IC) chip fabrication, and more particularly, to performing a stress test of a line in an integrated circuit (IC) chip.

2. Background Art

During integrated circuit (IC) chip fabrication, occasional mis-processing occurs such that the metal interconnect lines in the IC chip have thicknesses or widths that are locally less than a minimum limit. In addition, process changes involving, for example, chemical mechanical planarization (CMP), cap materials or deposition processes in copper (Cu) metallization, can alter the metal and cap interface in a way that degrades electromigration, i.e., the movement of metal caused by ion movement in the metal due to the momentum transfer between conducting electrons and diffusing metal atoms.

Because line thinning or narrowing caused by the mis-processing or process changes may be localized within the IC chip, the overall resistance of the particular line may or may not change appreciably. In a wide line, this localized thinning and/or width shrinkage might not have much impact. However, in a narrow line, localized thinning and/or width shrinkage can significantly impact the cross-sectional area of the line to the point of causing excessive current crowding and significantly higher current densities at the constricted spots. The higher current densities then result in temperature gradients and void formation and ultimate failure due to electromigration.

One approach to monitor in-line semiconductor metallurgy stability is accelerated wafer level electromigration (WLR EM) testing. A WLR EM test provides detailed information and is analogous to traditional, long-term, package level stresses which provide sufficient failure information for modeling. There are three different types of approaches which can be used for WLR EM testing: isothermal, standard wafer-level electromigration acceleration test (SWEAT), and steady current. In each case, the stress conditions are typically achieved through Joule heating (i.e., heating by use) alone, although underlying heaters can be placed along the length of the device to assist in reaching the target temperature, or to deliver the target temperature alone. It should be noted that non-WLR approaches using the same techniques are also available for which the structures under test are built into modules and the modules are placed into ovens that provide the temperature acceleration. The isothermal (ISOT) approach strives to maintain a constant metal line temperature through monitoring the metal line resistance and adjusting the applied current as necessary. The SWEAT test considers a target temperature and modulates the applied stress current to achieve that target temperature that will result in a target median lifetime for the metal line. The steady current approach applies a constant current through the structure, but changes the value of the constant current by a feedback mechanism that responds to small changes in the sensed resistance regardless of temperature. Hence, the current does not remain constant during stress testing, which can compromise the EM lifetime projections as well as the ability to understand the cause of failure through failure analysis.

The three accelerated WLR EM tests yield failure distributions which can be, more or less, related to those failure distributions obtained from package level stresses. Studies have also shown that such tests can be used to differentiate between process change failures or mis-processing failures. The three approaches typically show similar target temperatures, but give varying results for the shape of the fail distributions due to their sensitivity to metal geometry variations. None of the three methods correctly account for the localized relationship between a small resistance change and the overall temperature of the line and, hence, the current that should be applied. In addition, the three approaches do not allow the use of slope to project failure times.

SUMMARY

Methods, systems and program products are disclosed for performing a stress test of a line in an integrated circuit (IC) chip. One embodiment of the method includes: applying a constant current $I_s$ to the line; and stress testing the line while applying the constant current $I_s$ such that the constant current $I_s$ is not altered by a resistance change due to an onset of electromigration.

A first aspect of the disclosure provides a method of performing a stress test of a line in an integrated circuit (IC) chip, the method comprising: applying a constant current $I_s$ to the line; and stress testing the line while applying the constant current $I_s$ such that the constant current $I_s$ is not altered by a resistance change due to an onset of electromigration.

A second aspect of the disclosure provides a system for performing a stress test of a line in an integrated circuit (IC) chip, the system comprising: means for applying a constant current $I_s$ to the line; and means for stress testing the line while applying the constant current $I_s$ such that the constant current $I_s$ is not altered by a resistance change due to an onset of electromigration.

A third aspect of the disclosure provides a program product stored on a computer-usable medium, which when executed, performs a stress test of a line in an integrated circuit (IC) chip, the program product include program product for performing the following: applying a constant current $I_s$ to the line; and stress testing the line while applying the constant current $I_s$ such that the constant current $I_s$ is not altered by a resistance change due to an onset of electromigration.

A fourth aspect of the disclosure provides a computer-readable medium that includes computer program code to enable a computer infrastructure to perform a stress test to a line in an IC chip, the computer-readable medium comprising computer program code for performing the method steps of the disclosure.

A fifth aspect of the disclosure provides a business method for performing a stress test to a line in an IC chip, the business method comprising managing a computer infrastructure that performs each of the steps of the disclosure; and receiving payment based on the managing step.

A sixth aspect of the disclosure provides a method of generating a system for performing a stress test to a line in an IC chip, the method comprising: obtaining a computer infrastructure; and deploying means for performing each of the steps of the disclosure to the computer infrastructure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

I. Overview:

The present disclosure teaches a stress testing methodology that can be used with electromigration (EM) test structures, i.e., lines within an IC chip. The disclosure relates to a constant current approach, but includes several departures from previous wafer level EM test methodologies. In the processes described herein the current is held constant during the stress testing, rather than being changed by a feedback mechanism that responds to small changes in the sensed resistance. Whereas other 'constant current' approaches increase or decrease the applied voltage in response to minute changes in sensed resistance, the processes of this disclosure avoid changing the applied voltage once the target temperature has been reached. The reason for this departure is that the present disclosure treats temperature as a primary variable in the electromigration process, whereas current is considered a secondary variable. If the resistance change is, in fact, caused by small amounts of electromigration damage (local thinning of the metal, for example), then the temperature of the metal in the immediate vicinity of the damage will be somewhat greater than that far from the damage, but will not affect the temperature of the rest of the line. On the other hand, if the applied current is decreased due to the increase in sensed resistance, the temperature of the entire line will fall and the global mass transport (i.e., EM) will decrease, and will extend the life of the line. Since the temperature change is proportional to the square of the current change, alteration of the current will exacerbate errors in the temperature.

The processes of the current disclosure leverage the metal temperature coefficient of resistance (TCR). The TCR has been found to vary substantially with line width and metallization thickness, and also with temperature which is exacerbated at the higher temperatures. Since estimation of the line temperature depends directly on the value of the TCR, inaccuracy of the TCR leads to a proportional inaccuracy in the temperature. The dependencies of the TCR are considered in the algorithm of the disclosure.

The processes of the current disclosure use a controlled ramp procedure. The ramp procedure raises the current to a constant level as quickly as possible without causing an overvoltage or overcurrent condition (i.e., a spike) and then maintains that constant current level. Any spike would cause unwanted damage that would not be accounted for by the stress conditions. A quick ramp is desirable in order to minimize the test time to only that time during which the test conditions occur, and because a slow ramp will actually cause EM damage before the stress temperature is achieved, and therefore cause failure earlier than it would have if the current were applied instantaneously.

The line under stress is heated solely through joule heating, although an on-chip heater could be used to supply a portion of the heat. The total stress and test time can be set not to exceed 20 seconds or even less. Also, these times assume stress to fail, not stress for a few seconds and infer failure by the slope of a resistance difference ($\Delta R$) versus time comparison. The processes described herein teach how to apply the stress constant current $I_S$ very quickly yet without risking any overshoot and with a calibrated ramp to the ultimate constant current stress.

The processes described herein provide a better approximation to standard package EM testing and may be suitable to evaluate, in-line, EM reliability due to a shorter current ramp time to attain the required stress. The processes can also be used to compare performance of process changes and misprocessing changes, and removes the need for a complex feedback loop for control, which simplifies running and program reliability. Furthermore, the processes allow measurements to be less than the actual failure time, i.e., the processes are non-destructive and faster than the current state of the art.

Figure 1:
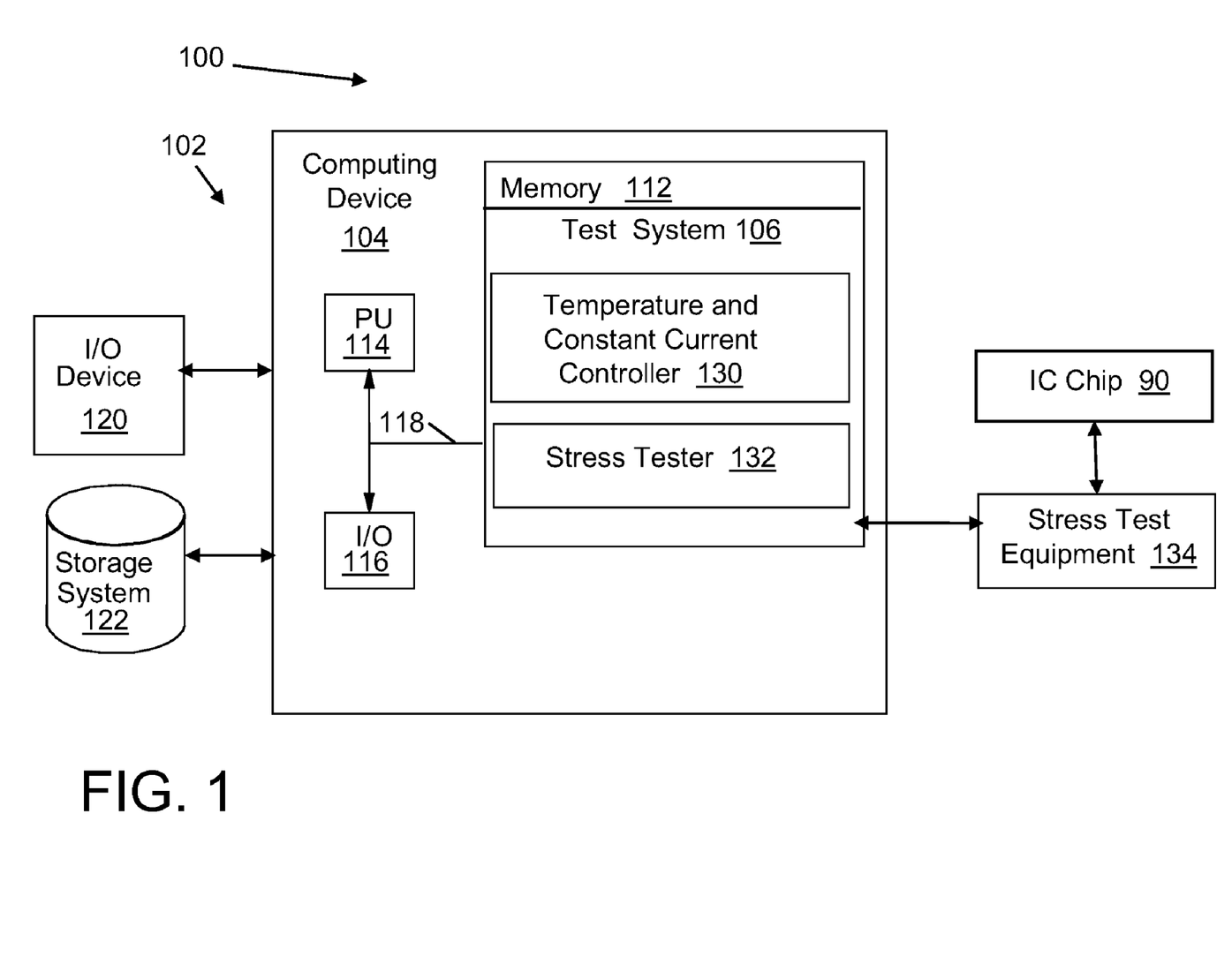
FIG. 1 shows a block diagram of one embodiment of a stress testing system according to the disclosure.

II. Computer Infrastructure:

Turning to the drawings, FIG. 1 shows an illustrative environment 100 for performing a stress test to a line in an IC chip 90. To this extent, environment 100 includes a computer infrastructure 102 that can perform the various process steps described herein for performing a stress test to a line in an IC chip. In particular, computer infrastructure 102 is shown including a computing device 104 that comprises a test system 106, which enables computing device 104 to perform a stress test to a line in IC chip 90 by performing the process steps of the disclosure.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as test system 106, that is stored in memory 112 and/or storage system 122. While executing computer program code, processor 114 can read and/or write data, such as test, to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and test system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As previously mentioned and discussed further below, test system 106 enables computing infrastructure 102 to perform a stress test to a line in IC chip 90. To this extent, test system 106 is shown including a temperature and constant current controller 130 and a stress tester 132. Operation of each of these systems is discussed further below. However, it is understood that some of the various systems and functions shown in FIG. 1 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 2:
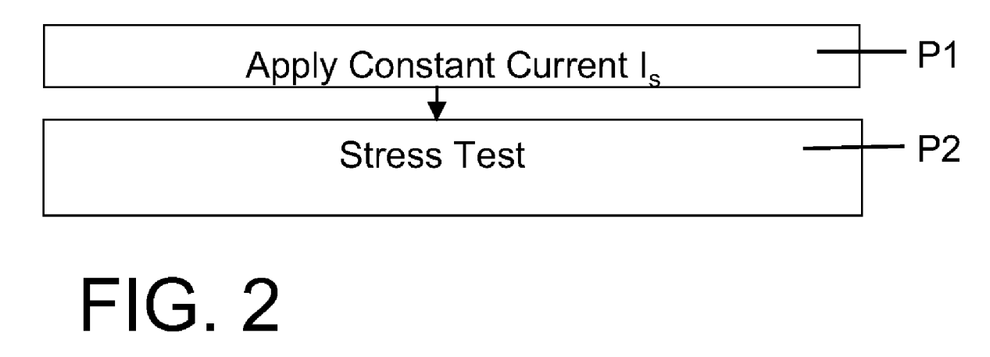
FIG. 2 shows one embodiment of a method of performing a stress test of a line in an IC chip according to the disclosure.

III. Operational Methodology:

Turning to FIGS. 2-6, embodiments of methods of performing a stress test of a line in IC chip 90 and related sub-methods will now be described. Turning to FIG. 2, in process P1, temperature and constant current controller 130 (hereinafter "TCC controller 130") applies a constant current $I_s$ to the line (in IC chip 90). In process P2, stress tester 132 performs stress testing of the line while applying constant current $I_s$ such that constant current $I_s$ is not altered by a resistance change due to an onset of electromigration.

Figure 3:
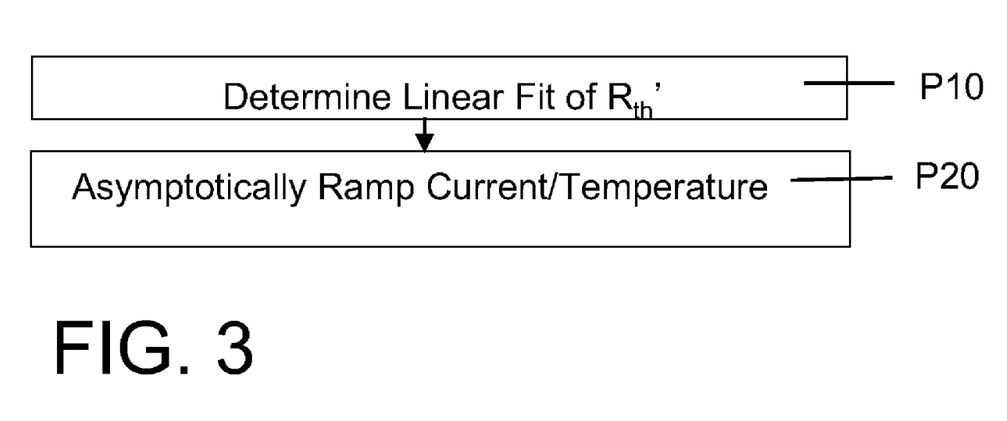
FIG. 3 shows one embodiment of a sub-method of performing a stress test of a line in an IC chip according to the disclosure.
Figure 4:
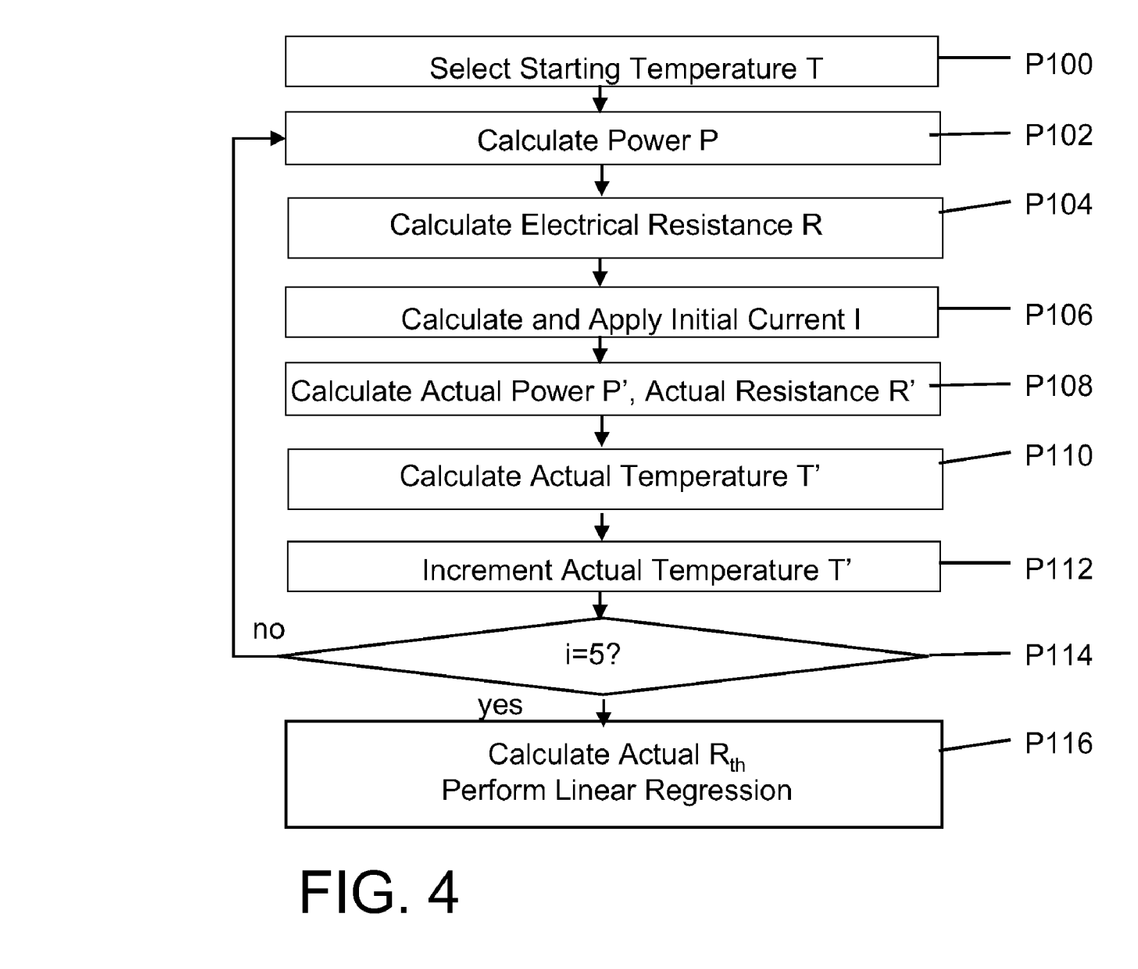
FIG. 4 shows one embodiment of a sub-method of performing a stress test of a line in an IC chip according to the disclosure.
Figure 5:
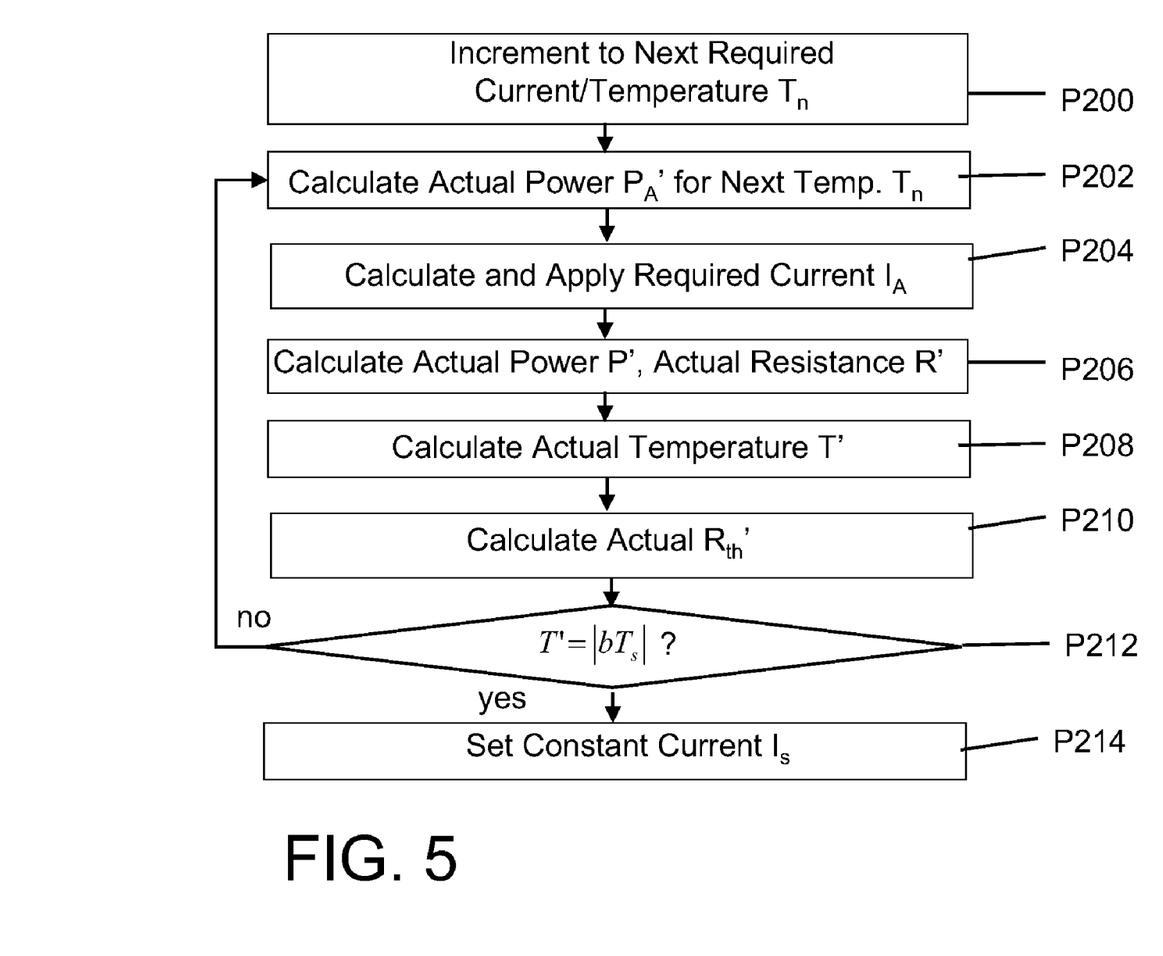
FIG. 5 shows one embodiment of a sub-method of performing a stress test of a line in an IC chip according to the disclosure.

Turning to FIGS. 3-5, embodiments of TCC controller 130 applying constant current $I_S$ to the line are shown. All of the processes of FIGS. 4-5 are carried out by TCC controller 130. Each process in FIG. 3 occurs prior to stress testing, i.e., process P2 in FIG. 2. In process P10, TCC controller 130 determines a linear fit of an actual thermal resistance $R_{th}$' of the line, and in process P20, TCC controller 130 asymptotically ramps a temperature of the line, e.g., through Joule heating and using standard stress testing equipment 134, to a predetermined target stress temperature $T_s$ based on the actual thermal resistance $R_{th}$'. As the applied current ramps asymptotically it also causes the temperature to asymptotically ramp. Predetermined target stress temperature $T_s$ is designed to minimize overshoot during the setting of constant current $I_S$, as will be described herein. In particular, predetermined target stress temperature $T_s$ is selected such that there is little, if any, current overshoot at the transition between ramping current (required current $I_A$, process P214 in FIG. 5) and the application of the constant current $I_s$.

FIG. 4 shows embodiments of the linear fit determining of process P10 in FIG. 3. In process P100, TCC controller 130 selects a starting temperature T. In one embodiment, the starting temperature T is substantially equal to a probe temperature $T_{chuck}$ of stress test equipment 134. In any event, the starting temperature is a significantly less than a predetermined target stress temperature Ts at which IC chip 90 will be tested. For example, for a $T_s$ of 425° C., the starting temperature may be 100° C. to allow for the asymptotic ramping.

In process P102, TCC controller 130 calculates a power P based on an assumed thermal resistance $R_{th}$. For example, power P may be calculated according to: $P=(T-T_{chuck})/R_{th}$. In process P104, an electrical resistance R of the line is calculated from a temperature coefficient of resistance $\beta$. For example, $R=R_0+\beta R_0(T-T_{chuck})$, where $R_0$ is an initial resistance of the line and $\beta$ is the temperature coefficient of resistance, T is the starting temperature and $T_{chuck}$ is the probe temperature.

In process P106, an initial current I for the line is calculated and applied to IC chip 90. In this case, the initial current I is calculated according to: $I=\sqrt{P/R}$.

In process P108, an actual power P' and a measured actual electrical resistance R' are calculated based on a measured (actual) voltage V' and a measured (actual) current I'. In this case, $P'=V'\times I'$ and $R'=V'/I'$.

In process P110, an actual temperature T' is calculated based on the measured (actual) electrical resistance R'. Actual temperature T' may be calculated according to: $T'=T_{chuck}+([R'-R_0]/\beta R_0)$, where $T_{chuck}$ is the probe temperature, R' is the actual electrical resistance, $R_0$ is an initial resistance of the line and $\beta$ is the temperature coefficient of resistance.

In process P112, the actual temperature T' is incremented by a small value. A "small value" may vary depending on how close the actual temperature T is to the predetermined target stress temperature $T_s$. For example, an increment may be approximately 20° C. where the starting temperature T is 100° C. and the predetermined target stress temperature $T_S$ is 425° C.

In process P114, processes P102-P112 are repeated a sufficient number of times such that a linear regression can be performed for thermal resistance $R_{th}$. In one embodiment, processes P102-P112 may be repeated at least four times. However, this number may vary depending on IC chip 90. Any number of repetitions that will allow for an accurate linear regression for thermal resistance $R_{th}$ may be acceptable.

In process P116, an actual thermal resistance $R_{th}$' is calculated based on the actual temperature T', a probe temperature $T_{chuck}$ and the actual power P'. In this case, $R_{th}'=(T'-T_{chuck})/P'$, and is calculated by performing a linear regression for the actual thermal resistance $R_{th}$' to determine the linear fit thereof. Any now known or linear regression technique may be employed.

FIG. 5 shows embodiments of asymptotically ramping current, i.e., process P20 in FIG. 3, and hence temperature. In process P200, the current is incremented such that a next temperature $T_n$ moves towards the predetermined target stress temperature $T_s$ in an asymptotic manner. There are various asymptotic manners that may be employed. In one embodiment, $T_n$ may be calculated according to 0.5 ($T_s$-T'), where $T_s$ is the predetermined target stress temperature and T' is the actual temperature. Other techniques are also possible.

In process P202, an actual power $P_A'$ is calculated for the next temperature $T_n$ based on the actual thermal resistance $R_{th}'$. In this case, actual power $P_A'$ may be calculated according to $P_A'=(T_n-T_{chuck})/R_{th}'$, where the actual thermal resistance $R_{th}'$ is calculated according to step P116 (FIG. 4) for the first iteration, and the current process for subsequent iterations. In process P204, a required current $I_A$ is calculated and applied based on the actual power $P_A'$ and the actual electrical resistance R'. Required current $I_A=\sqrt{P_A'/R'}$, where the actual resistance R' is calculated according to process P108 for the first iteration, the current process for subsequent iterations.

In process P206, an actual power P' and an actual electrical resistance R' are calculated based on a measured (actual) voltage V' and a measured (actual) current I'. In this case, $P'=V'\times I'$ and $R'=V'/I'$. In process P208, actual temperature T' is calculated based on a measured electrical resistance R'. Actual temperature T' may be calculated according to: $T'=T_{chuck}+([R'-R_0]/\beta R_0)$, where $T_{chuck}$ is the probe temperature, R' is the actual electrical resistance, $R_0$ is an initial resistance of the line and $\beta$ is the temperature coefficient of resistance.

In process P210, the actual thermal resistance $R_{th}'$ is calculated based on the actual temperature T', the probe temperature $T_{chuck}$ and the actual power P'. In this case, $R_{th}'=(T'-T_{chuck})/P'$. In this case, the actual temperature T' will be different from the assumed starting temperature, i.e., next temperature, $T_n$, for this iteration.

Process P212 includes determining whether actual temperature T' is within a threshold of the predetermined target stress temperature $T_S$, e.g., $T'=|bT_S|$, where b is a value less than 1.0 and typically would be less than 0.01.

Processes P202 through P210 are then repeated in the case that actual temperature T' is not within the threshold of predetermined target stress temperature $T_s$ (i.e., no at process P212). Otherwise (i.e., yes at process P212), constant current $I_S$ is set for the line as the required current $I_A$ for the stress testing (all of process P2 in FIG. 2). As stated above, once the predetermined target stress temperature $T_s$ is selected, the asymptotic current ramp is chosen such that there is little, if any, current overshoot at the transition between ramping current (required current $I_A$, process P214 in FIG. 5) and the application of the constant current $I_s$.

Figure 6:
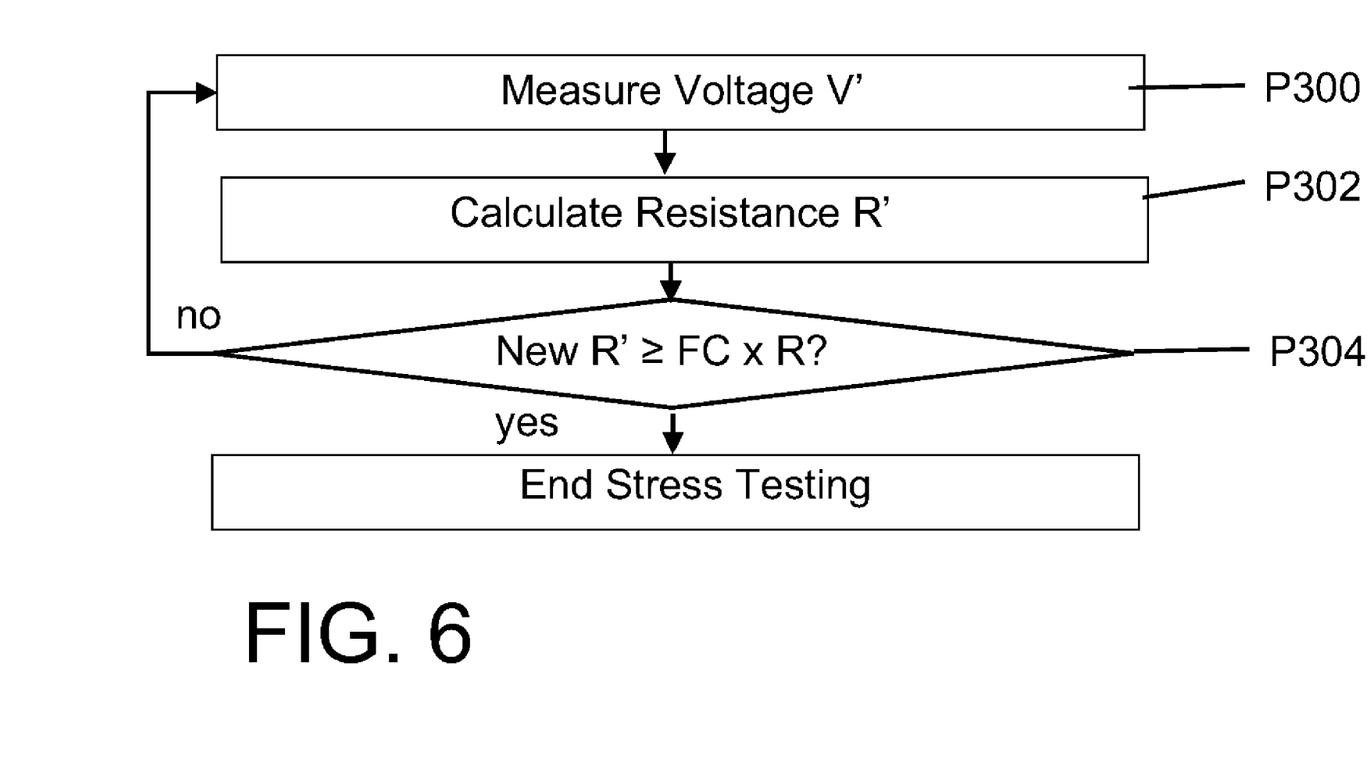
FIG. 6 shows one embodiment of a sub-method of performing a stress test of a line in an IC chip according to the disclosure.

Turning to FIG. 6, embodiments of stress testing (process P2 in FIG. 2) will now be described. In process P300, stress tester 132 (FIG. 1) measures an actual voltage V' and in process P302 calculates actual resistance R', i.e., $R'=V'/I'$ where I' is constant current $I_S$. In process P304, stress evaluation is made by determining whether the new actual resistance R' is greater than a threshold resistance based on a failure criterion FC, i.e., FC×R. In one embodiment, failure criterion FC is predefined by a given resistance shift $\Delta R_1$. In another embodiment, failure criterion FC may be predefined by a given slope of a rate of resistance shift $m_1$ of a resistance shift versus time curve. In particular, a good correlation has been found between the slope of the resistance shift, $m_1$, versus time, and a predefined failure criterion FC resistance shift, $\Delta R_1$. The predefined slope detection of the resistance shift $\Delta R_1$ occurs after some stress time $T_m$, which can be significantly shorter than an actual failure time $T_1$. Based on this information, failure criterion FC may include an absolute value of the given resistance shift $\Delta R_m$ at a time prior to an actual failure time $T_1$ based on (or inferred from) the slope $m_1$ of the resistance versus time curve. The line under stress can then be deduced to be facing eminent failure, and this line can then be failure analyzed to determine the position and evidence of the start of failure. This approach is in contrast to failure analysis of lines that have had a rapid stress and have failed due to surpassing a set resistance shift criterion, $\Delta R_1$, for which only large areas of damage are usually seen.

This disclosure teaches processes for a fast wafer level electromigration stress testing using constant current for the purpose of detecting changes in the processing of metal lines and/or mis-processing. This approach is fast enough to be used in the manufacturing line, and sensitive enough to detect small localized changes in narrow lines.

IV. Conclusion:

As discussed herein, various systems and components are described as "obtaining" data (e.g., stored temperature values, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system for performing a stress test to a line in an IC chip, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to perform a stress test to a line in an IC chip. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as storage system 122, magnetic tape, a removable computer diskette, a random access memory (RAM), a read-only memory (ROM), a tape, a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processing unit (PU) 114 coupled directly or indirectly to memory elements through a system bus 118. The memory elements can include local memory, e.g., memory 112, employed during actual execution of the program code, bulk storage (e.g., memory system 122), and cache memories which provide temporary storage of at least some program code in order to reduce the number of times code must be retrieved from bulk storage during execution.

In another embodiment, the disclosure provides a method of generating a system for performing a stress test to a line in an IC chip. In this case, a computer infrastructure, such as computer infrastructure 102 (FIG. 1), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider, could offer to perform a stress test to a line in an IC chip as described herein. In this case, the service provider can manage (e.g., create, maintain, support, etc.) a computer infrastructure, such as computer infrastructure 102 (FIG. 1), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of performing a stress test of a line in an integrated circuit (IC) chip, the method comprising:
   applying a constant current $I_s$ to the line, wherein the applying the constant current to the line further comprises:
   determining a linear fit of an actual thermal resistance $R_{th}'$ of the line, wherein the linear fit determining includes:
   a) selecting a starting temperature T;
   b) calculating a power P based on an assumed thermal resistance $R_{th}$;
   c) calculating an electrical resistance R of the line from a temperature coefficient of resistance β;
   d) calculating and applying an initial current I for the line;
   e) calculating an actual power P' and a measured electrical resistance R' based on a measured voltage V' and a measured current I';
   f) calculating an actual temperature T' based on the measured electrical resistance R';
   g) incrementing the actual temperature T by a small value;
   h) repeating processes b) through g) a number of times sufficient for a linear regression calculation to be performed for the thermal resistance $R_{th}$;
   i) calculating an actual thermal resistance $R_{th}'$ based on the actual temperature T', a probe temperature $T_{chuck}$ and the actual power P' by performing a linear regression for the actual thermal resistance $R_{th}'$; and
   asymptotically ramping a temperature of the line to a predetermined target stress temperature $T_s$ based on the actual thermal resistance $R_{th}'$, the asymptotic temperature ramping caused by an applied current to ramp asymptotically, wherein the asymptotic temperature ramping includes:
   j) incrementing to a next required current $I_A$ such that a next temperature $T_n$ moves toward the predetermined target stress temperature $T_s$ in an asymptotic manner;
   k) calculating an actual power $P_A'$ for the next temperature $T_n$ based on the actual thermal resistance $R_{th}'$;
   l) calculating and applying a required current $I_A$ based on the actual power $P_A'$ and the actual electrical resistance R';
   m) calculating an actual power P' and an actual electrical resistance R' based on a measured voltage V' and a measured current I';
   n) calculating the actual temperature T' based on a measured electrical resistance R';
   o) calculating the actual thermal resistance $R_{th}'$ based on the actual temperature T', the probe temperature $T_{chuck}$ and the actual power P';
   p) determining whether the actual temperature T' is within a threshold of the predetermined target stress temperature $T_s$; and
   q) repeating processes k) through p) in the case that the actual temperature T' is not within the threshold of the predetermined target stress temperature $T_s$, and, otherwise, setting the constant current $I_s$ for the line as the required current $I_A$ for the stress testing; and
   stress testing the line while applying the constant current $I_s$, wherein the constant current $I_s$ is not altered by a resistance change due to an onset of electromigration.

2. The method of claim 1, wherein the electrical resistance R calculation is according to: $R=R_0+\beta R_0(T-T_{chuck})$, where $R_0$ is an initial resistance of the line and β is a temperature coefficient of resistance, T is a starting temperature and $T_{chuck}$ is the probe temperature.

3. The method of claim 1, wherein the actual temperature T' calculation is according to: $T'=T_{chuck}+([R'-R_0]/\beta R_0)$, where $T_{chuck}$ is the probe temperature, R' is the actual electrical resistance, $R_0$ is an initial resistance of the line and β is the temperature coefficient of resistance.

4. The method of claim 1, wherein the actual thermal resistance $R_{th}'$ calculating is according to: $R_{th}'=(T'-T_{chuck})/P'$.

5. The method of claim 1, wherein the predetermined target stress temperature $T_s$ is asymptotically approached in a manner designed to minimize temperature overshoot by controlling the applying of the required current $I_A$.

6. The method of claim 1, wherein a failure criterion of the stress testing is predefined by a given resistance shift $\Delta R_1$.

7. The method of claim 6, wherein the failure criterion includes an absolute value of the given resistance shift $\Delta R_1$ at a time prior to an actual failure time $T_1$ based on the slope $m_1$ of a resistance versus time curve.

8. The method of claim 1, wherein a failure criterion of the stress testing is predefined by a given slope of a resistance versus time curve.

9. A system for performing a stress test of a line in an integrated circuit (IC) chip, the system comprising:
  means for applying a constant current $I_s$ to the line, wherein the applying means further comprises:
    means for determining a linear fit of an actual thermal resistance $R_{th}'$ of the line, wherein the linear fit determining means includes means for:
      a) selecting a starting temperature T;
      b) calculating a power P based on an assumed thermal resistance $R_{th}$;
      c) calculating an electrical resistance R of the line from a temperature coefficient of resistance β;
      d) calculating and applying an initial current I for the line;
      e) calculating an actual power P' and a measured electrical resistance R' based on a measured voltage V' and a measured current I';
      f) calculating an actual temperature T' based on the measured electrical resistance R';
      g) incrementing the actual temperature T by a small value;
      h) repeating processes b) through g) at least four times; and
      i) calculating an actual thermal resistance $R_{th}'$ based on the actual temperature T', a probe temperature $T_{chuck}$ and the actual power P' by performing a linear regression for the actual thermal resistance $R_{th}'$; and
  means for asymptotically ramping a temperature of the line to a predetermined target stress temperature $T_s$ based on the actual thermal resistance $R_{th}'$, the asymptotic temperature ramping being caused by an applied current ramping asymptotically, wherein the asymptotic ramping means includes means for:
      j) incrementing to a next required current $I_A$ such that a next temperature $T_n$ moves toward the predetermined target stress temperature $T_s$ in an asymptotic manner;
      k) calculating an actual power $P_A'$ for the next temperature $T_n$ based on the actual thermal resistance $R_{th}'$;
      l) calculating and applying a required current $I_A$ based on the actual power $P_A'$ and the actual electrical resistance R';
      m) calculating an actual power P' and an actual electrical resistance R' based on a measured voltage V' and a measured current I';
      n) calculating the actual temperature T' based on a measured electrical resistance R';
      o) calculating the actual thermal resistance $R_{th}'$ based on the actual temperature T', the probe temperature $T_{chuck}$ and the actual power P';
      p) determining whether the actual temperature T' is within a threshold of the predetermined target stress temperature $T_s$; and
      q) repeating processes k) through p) in the case that the actual temperature T' is not within the threshold of the predetermined target stress temperature $T_s$, and, otherwise, setting the constant current $I_s$ for the line as the required current $I_A$ for the duration of the stress testing; and
  means for stress testing the line while applying the constant current $I_s$, wherein the constant current $I_s$ is not altered by a resistance change due to an onset of electromigration.

10. The system of claim 9, wherein the predetermined target stress temperature $T_s$ is asymptotically approached in a manner designed to minimize temperature overshoot by controlling the applying of the required current $I_A$.

11. The system of claim 9, wherein a failure criterion of the stress testing is predefined by a given resistance shift $\Delta R_1$.

12. The system of claim 11, wherein the failure criterion includes an absolute value of the given resistance shift $\Delta R_1$ at a time prior to an actual failure time $T_1$ based on the slope $m_1$ of the resistance versus time curve.

13. The system of claim 9, wherein a failure criterion of the stress testing is predefined by a given slope of a resistance versus time curve.

14. A program product stored on a computer-usable medium, which when executed, performs a stress test of a line in an integrated circuit (IC) chip, the program product include program product for performing the following:
  applying a constant current $I_s$ to the line, wherein the applying the constant current to the line further comprises:
    determining a linear fit of an actual thermal resistance $R_{th}'$ of the line, wherein the linear fit determining includes:
      a) selecting a starting temperature T;
      b) calculating a power P based on an assumed thermal resistance $R_{th}$;
      c) calculating an electrical resistance R of the line from a temperature coefficient of resistance β;
      d) calculating and applying an initial current I for the line;
      e) calculating an actual power P' and a measured electrical resistance R' based on a measured voltage V' and a measured current I';
      f) calculating an actual temperature T' based on the measured electrical resistance R';
      g) incrementing the actual temperature T by a small value;
      h) repeating processes b) through g) a number of times sufficient for a linear regression calculation to be performed for the thermal resistance $R_{th}$;
      i) calculating an actual thermal resistance $R_{th}'$ based on the actual temperature T', a probe temperature $T_{chuck}$ and the actual power P' by performing a linear regression for the actual thermal resistance $R_{th}'$; and
  asymptotically ramping a temperature of the line to a predetermined target stress temperature $T_s$ based on the actual thermal resistance $R_{th}'$, the asymptotic temperature ramping caused by an applied current to ramp asymptotically, wherein the asymptotic temperature ramping includes:
      j) incrementing to a next required current $I_A$ such that a next temperature $T_n$ moves toward the predetermined target stress temperature $T_s$ in an asymptotic manner;
      k) calculating an actual power $P_A'$ for the next temperature $T_n$ based on the actual thermal resistance $R_{th}'$;
      l) calculating and applying a required current $I_A$ based on the actual power $P_A'$ and the actual electrical resistance R';
      m) calculating an actual power P' and an actual electrical resistance R' based on a measured voltage V' and a measured current I';

n) calculating the actual temperature T' based on a measured electrical resistance R';
o) calculating the actual thermal resistance $R_{th}'$ based on the actual temperature T', the probe temperature $T_{chuck}$ and the actual power P';
p) determining whether the actual temperature T' is within a threshold of the predetermined target stress temperature $T_s$; and
q) repeating processes k) through p) in the case that the actual temperature T' is not within the threshold of the predetermined target stress temperature $T_s$, and, otherwise, setting the constant current $I_s$ for the line as the required current $I_A$ for the stress testing; and stress testing the line while applying the constant current $I_s$, wherein the constant current $I_s$ is not altered by a resistance change due to an onset of electromigration.

* * * * *